(12) United States Patent
Sato et al.

(10) Patent No.: US 12,068,437 B2
(45) Date of Patent: Aug. 20, 2024

(54) LIGHT EMITTING ELEMENT

(71) Applicant: NICHIA CORPORATION, Anan (JP)

(72) Inventors: Kosuke Sato, Anan (JP); Keiji Emura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/295,511

(22) Filed: Apr. 4, 2023

(65) Prior Publication Data

US 2023/0238489 A1 Jul. 27, 2023

Related U.S. Application Data

(63) Continuation of application No. 17/200,316, filed on Mar. 12, 2021, now Pat. No. 11,817,529, which is a
(Continued)

(30) Foreign Application Priority Data

Dec. 9, 2013 (JP) ................................. 2013-254243
Nov. 21, 2014 (JP) ................................. 2014-236462

(51) Int. Cl.
*H01L 33/00* (2010.01)
*H01L 33/06* (2010.01)
*H01L 33/38* (2010.01)

(52) U.S. Cl.
CPC ............ *H01L 33/387* (2013.01); *H01L 33/06* (2013.01); *H01L 33/38* (2013.01)

(58) Field of Classification Search
CPC ........ H01L 33/387; H01L 33/38; H01L 33/06
(Continued)

(56) References Cited

U.S. PATENT DOCUMENTS 6,307,218 B1   10/2001   Steigerwald et al.
7,947,996 B2    5/2011   Sakamoto et al.
(Continued)

FOREIGN PATENT DOCUMENTS

CN   101794850 A   8/2010
CN   102549782 A   7/2012
(Continued)

OTHER PUBLICATIONS

Advisory Action in U.S. Appl. No. 14/560,224, dated May 9, 2016.
(Continued)

*Primary Examiner* — Tan N Tran
(74) *Attorney, Agent, or Firm* — Foley & Lardner LLP

(57) ABSTRACT

A light emitting element includes: a semiconductor structure; first and second electrodes formed above the semiconductor structure; and a protective film. In a plan view: the first electrode has a first connecting portion, a first extending portion, and two second extending portions, the second electrode has a second connecting portion, and two third extending portions, the first extending portion extends linearly in a direction from the first connecting portion toward the second connecting portion, the two second extending portions are located on opposite sides of the first extending portion, respectively, with each of the second extending portions having two bent portions and a linear portion extending parallel to the first extending portion and located between the two bent portions, and the two third extending portions are located between the first extending portion and the two second extending portions, respectively.

31 Claims, 10 Drawing Sheets

Related U.S. Application Data continuation of application No. 16/785,143, filed on Feb. 7, 2020, now Pat. No. 10,978,617, which is a continuation of application No. 16/351,206, filed on Mar. 12, 2019, now Pat. No. 10,593,840, which is a continuation of application No. 15/835,175, filed on Dec. 7, 2017, now Pat. No. 10,276,751, which is a continuation of application No. 15/399,196, filed on Jan. 5, 2017, now Pat. No. 9,882,093, which is a continuation of application No. 14/560,224, filed on Dec. 4, 2014, now Pat. No. 9,577,152.

(58) Field of Classification Search
USPC .......................................... 257/98, 99, 100
See application file for complete search history.

(56) References Cited

U.S. PATENT DOCUMENTS

| | | | |
|---|---|---|---|
| 8,148,736 | B2 | 4/2012 | Yahata et al. |
| 8,872,204 | B2 | 10/2014 | Yang et al. |
| 8,941,335 | B2 | 1/2015 | Kono et al. |
| 9,130,125 | B2 | 9/2015 | Hwang et al. |
| 9,577,152 | B2 | 2/2017 | Sato et al. |
| 9,882,093 | B2 | 1/2018 | Sato et al. |
| 10,276,751 | B2 | 4/2019 | Sato et al. |
| 10,593,840 | B2 | 3/2020 | Sato et al. |
| 2003/0107053 | A1 | 6/2003 | Uemura et al. |
| 2003/0218176 | A1 | 11/2003 | Zhao et al. |
| 2004/0232454 | A1 | 11/2004 | Uemura et al. |
| 2009/0179215 | A1 | 7/2009 | Matsui et al. |
| 2010/0140656 | A1 | 6/2010 | Kim et al. |
| 2010/0181595 | A1 | 7/2010 | Oriji et al. |
| 2010/0258824 | A1 | 10/2010 | Wang et al. |
| 2011/0156070 | A1 | 6/2011 | Yoon et al. |
| 2011/0278631 | A1 | 11/2011 | Shen et al. |
| 2012/0018766 | A1 | 1/2012 | Emura |
| 2012/0049223 | A1* | 3/2012 | Yang ............... H01L 33/42 438/22 |
| 2012/0098023 | A1 | 4/2012 | Weng et al. |
| 2012/0199868 | A1 | 8/2012 | Inoue et al. |
| 2012/0248490 | A1 | 10/2012 | Weng et al. |
| 2012/0267658 | A1 | 10/2012 | Zhang et al. |
| 2013/0207153 | A1 | 8/2013 | Kamiya et al. |
| 2013/0234192 | A1 | 9/2013 | Kim et al. |
| 2014/0231859 | A1* | 8/2014 | Kim ............... H01L 33/32 257/99 |
| 2015/0076536 | A1 | 3/2015 | Ou et al. |

FOREIGN PATENT DOCUMENTS

| | | | |
|---|---|---|---|
| CN | 102751414 | A | 10/2012 |
| EP | 2 372 792 | A2 | 10/2011 |
| JP | 2000-164930 | A | 6/2000 |
| JP | 2001-345480 | A | 12/2001 |
| JP | 2002-319704 | A | 10/2002 |
| JP | 2004-056109 | A | 2/2004 |
| JP | 2005-039284 | A | 2/2005 |
| JP | 2011-061077 | A | 3/2011 |
| JP | 2011-139037 | A | 7/2011 |
| JP | 2011-142324 | A | 7/2011 |
| JP | 2011-146561 | A | 7/2011 |
| JP | 2012-089695 | A | 5/2012 |
| JP | 2012-164782 | A | 8/2012 |
| JP | 2012-216771 | A | 11/2012 |
| JP | 2013-098211 | A | 5/2013 |
| JP | 2013-168444 | A | 8/2013 |
| KR | 20100064050 | A | 6/2010 |
| WO | WO-2010/064870 | A2 | 6/2010 |
| WO | WO-2011/008038 | A2 | 1/2011 |
| WO | WO-2011/083923 | A2 | 7/2011 |
| WO | WO-2012/011458 | A1 | 1/2012 |
| WO | WO-2012/067311 | A1 | 5/2012 |

OTHER PUBLICATIONS

Advisory Action in U.S. Appl. No. 15/835,175, dated Nov. 6, 2018.
Corrected Notice of Allowance in U.S. Appl. No. 15/399,196, dated Dec. 28, 2017.
Extended European Search Report of the corresponding European application No. 14196433.8, dated Apr. 23, 2015.
Extended European Search Report of the corresponding European Patent Application No. 18171860.2, dated Sep. 5, 2018.
Final Office Action in U.S. Appl. No. 14/560,224, dated Mar. 3, 2016.
Final Office Action in U.S. Appl. No. 15/835,175, dated Aug. 24, 2018.
Non Final Office Action (2nd) in U.S. Appl. No. 14/560,224, dated Jun. 16, 2016.
Non Final Office Action in U.S. Appl. No. 14/560,224, dated Oct. 23, 2015.
Non Final Office Action in U.S. Appl. No. 15/399,196, dated Jun. 5, 2017.
Non Final Office Action in U.S. Appl. No. 15/835,175, dated Apr. 4, 2018.
Non-Final Office Action in U.S. Appl. No. 16/351,206, dated Jun. 27, 2019.
Non-Final Office Action in U.S. Appl. No. 16/785,143, dated May 28, 2020.
Notice of Allowance (2nd) in U.S. Appl. No. 16/785,143, dated Sep. 2, 2020.
Notice of Allowance (3rd) in U.S. Appl. No. 16/785,143, dated Oct. 7, 2020.
Notice of Allowance (4th) in U.S. Appl. No. 16/785,143, dated Dec. 23, 2020.
Notice of Allowance in U.S. Appl. No. 14/560,224, dated Oct. 7, 2016.
Notice of Allowance in U.S. Appl. No. 15/399,196, dated Sep. 25, 2017.
Notice of Allowance in U.S. Appl. No. 15/835,175, dated Dec. 14, 2018.
Notice of Allowance in U.S. Appl. No. 16/351,206, dated Nov. 8, 2019.
Notice of Allowance in U.S. Appl. No. 16/785,143, dated Sep. 2, 2020.
Restriction Requirement in U.S. Appl. No. 14/560,224, dated Jul. 22, 2015.
Non-Final Rejection in U.S. Appl. No. 17/200,316, dated Jun. 22, 2022.
Notice of Allowance in U.S. Appl. No. 17/200,316, dated Jan. 12, 2023.

* cited by examiner

100

10A

50

80

LIGHT EMITTING ELEMENT

CROSS-REFERENCE TO RELATED APPLICATIONS

This is a continuation application of U.S. patent application Ser. No. 17/200,316, filed on Mar. 12, 2021, which is a continuation application of U.S. patent application Ser. No. 16/785,143, filed on Feb. 7, 2020, now U.S. Pat. No. 10,978,617, which is a continuation application of U.S. patent application Ser. No. 16/351,206, filed on Mar. 12, 2019, now U.S. Pat. No. 10,593,840, which is a continuation application of U.S. patent application Ser. No. 15/835,175, filed on Dec. 7, 2017, now U.S. Pat. No. 10,276,751, which is a continuation application of U.S. patent application Ser. No. 15/399,196, filed on Jan. 5, 2017, now U.S. Pat. No. 9,882,093, which is a continuation application of U.S. patent application Ser. No. 14/560,224, filed on Dec. 4, 2014, now U.S. Pat. No. 9,577,152. This application claims priority to Japanese Patent Application No. 2013-254243, filed on Dec. 9, 2013, and Japanese Patent Application No. 2014-236462, filed on Nov. 21, 2014. The entire disclosures of U.S. patent application Ser. Nos. 17/200,316, 16/785,143, 16/351,206, 15/835,175, 15/399,196 and 14/560,224, and Japanese Patent Application Nos. 2013-254243 and 2014-236462 are hereby incorporated herein by reference.

BACKGROUND

Technical Field

The present disclosure relates to a light emitting element, and particularly to an electrode structure of the light emitting element.

Related Art

There have been made various developments to obtain a uniform emission from a light emitting element. For example, for a light emitting element having a quadrilateral outer shape, electrode structures in which either a second electrode or a first electrode is disposed at a center portion of an upper surface of a light emitting element, and the other electrode is disposed embracing it (for example, JP 2011-61077 A, JP 2012-89695 A and JP 2011-139037 A).

Each of those various electrode structures is proposed aiming to obtain a uniform distribution of current density to obtain a uniform emission over the entire surface of the light emitting element. However, even with those structures, a deviation in the distribution of current density within a region disposing between the second electrode and the first electrode occurs, which may cause concern of insufficient for obtaining a uniform emission.

SUMMARY

Accordingly, the present disclosure is devised to solve the problems as described above, and is aimed to provide a light emitting element reducing uneven distribution of the current density between the electrodes.

The present disclosure relates to a light emitting element. The light emitting element according to one aspect includes a semiconductor structure, and first and second electrodes formed above the semiconductor structure. In a plan view, the first electrode has a first connecting portion configured to be bonded with a first conductive wire, and exactly three extending portions extending from the first electrode connecting portion, the three extending portions being a first extending portion, and exactly two second extending portions. The second electrode has a second connecting portion configured to be bonded with a second conductive wire, and exactly two third extending portions extending from the second connecting portion. The first extending portion extends linearly in a direction from the first electrode connecting portion toward the second electrode connecting portion. Each of the two second extending portions includes a bent portion, and a linear portion that extends in a direction substantially parallel to the direction in which the first extending portion extends. Each of the two third extending portions includes a bent portion, and a linear portion that extends in a direction substantially parallel to the direction in which the first extending portion extends and that is located between the first extending portion and a respective one of the linear portions of the two second extending portions, and along an imaginary line that extends through the two second extending portions and the two third extending portions in a direction perpendicular to the direction in which the first extending portion extends, an entirety of the second electrode is located inward of the two second extending portions.

A light emitting element according to another aspect includes a semiconductor structure, and first and second electrodes formed above the semiconductor structure. In a plan view, the first electrode has a first connecting portion configured to be bonded with a first conductive wire, and exactly three extending portions extending from the first electrode connecting portion, the three extending portions being a first extending portion, and exactly two second extending portions. The second electrode has a second connecting portion configured to be bonded with a second conductive wire, and exactly four extending portions extending from the second connecting portion, the four extending portions being exactly two third extending portions, and exactly two fourth extending portions. The first extending portion extends linearly in a direction from the first electrode connecting portion toward the second electrode connecting portion. Each of the two second extending portions includes a bent portion, and a linear portion that extends in a direction substantially parallel to the direction in which the first extending portion extends. Each of the two third extending portions includes a bent portion, and a linear portion that extends in a direction substantially parallel to the direction in which the first extending portion extends and that is located between the first extending portion and a respective one of the linear portions of the two second extending portions. Each of the two fourth extending portions includes a bent portion, and a linear portion that extends in a direction substantially parallel to the direction in which the first extending portion extends. Each of the two second extending portions is located between a respective one of the linear portions of the two third extending portions and a respective one of the linear portions of the two fourth extending portions.

With the light emitting element according to the present disclosure, uneven distribution of the current density between the electrodes can be reduced.

DETAILED DESCRIPTION OF THE EMBODIMENTS

Figure 1A:
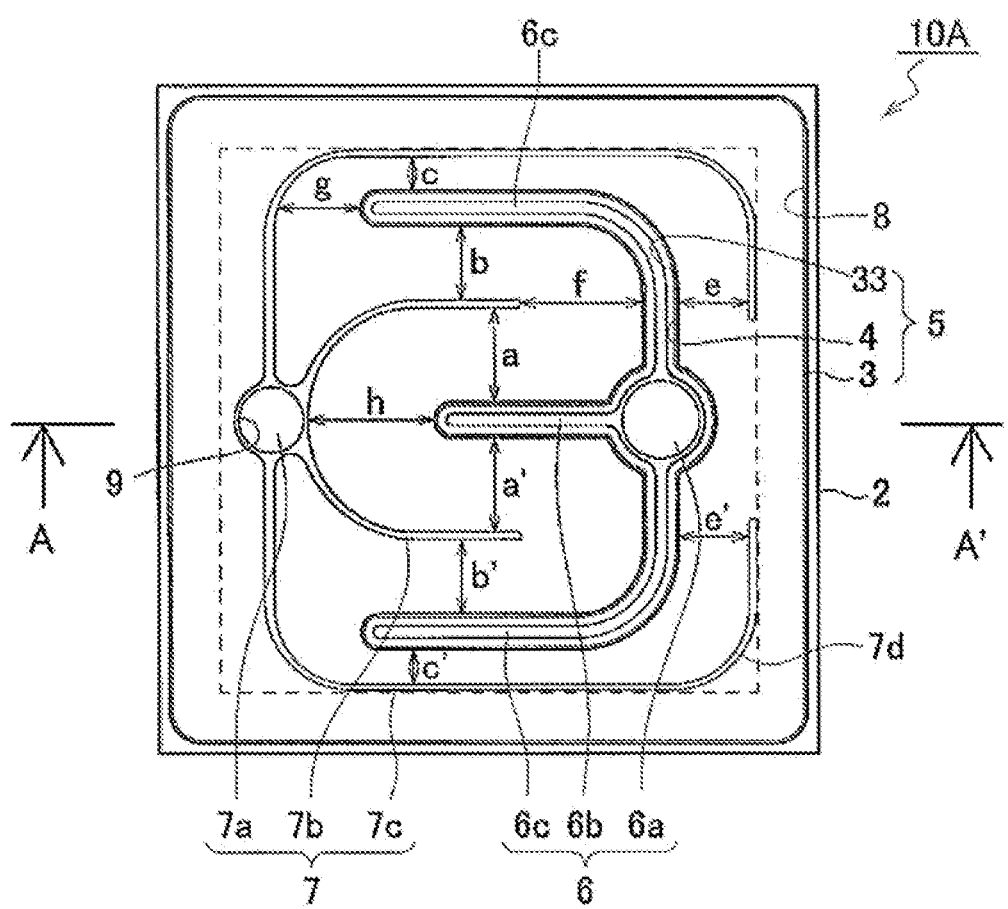
FIG. 1A is a plan view showing a light emitting element according to Embodiment 1 of the present disclosure.

Embodiments for implementing the light emitting element of the present disclosure will be described below with reference to the accompanying drawings. The sizes and the arrangement relationships of the members in each of drawings are occasionally shown exaggerated for ease of explanation. Further, in the description below, the same designations or the same reference numerals may, in principle, denote the same or like members and duplicative descriptions will be appropriately omitted. In addition, a plurality of structural elements of the present disclosure may be configured as a single part which serves the purpose of a plurality of elements, on the other hand, a single structural element may be configured as a plurality of parts which serve the purpose of a single element. Further, constitutions described in some of examples and embodiments can be employed in other examples and embodiments.

The light emitting element of the present disclosure has a first conductivity type semiconductor layer, a second conductivity type semiconductor layer, a first electrode formed on the first conductivity type semiconductor layer, and a second electrode formed on the second conductivity type semiconductor layer. The first electrode and the second electrode are disposed on the same face side of the first conductivity type semiconductor layer and the second conductivity type semiconductor layer.

Here, the first conductivity type semiconductor layer and the second conductivity type semiconductor layer have different types of conductivity. The first conductivity type semiconductor layer may be either n type or p type. The second conductivity type semiconductor layer is p type if the first conductivity type semiconductor layer is n type, and vice versa.

(First Conductivity Type Semiconductor Layer and Second Conductivity Type Semiconductor Layer)

The first conductivity type semiconductor layer and the second conductivity type semiconductor layer are members that serve as light emitting components in a light emitting element, and are usually stacked to constitute a semiconductor stack. The first conductivity type semiconductor layer and the second conductivity type semiconductor layer may each have a single-layer structure, or may have a laminated structure. In the case of a laminated structure, not all of the layers that make up the first conductivity type semiconductor layer and the second conductivity type semiconductor layer need to exhibit the first or second conductivity type. Usually, an active layer (light emitting layer) is disposed between these semiconductor layers. The active layer may have either a multiple quantum well structure or a single quantum well structure formed in a thin-film that produces a quantum effect. Of those structures, a structure having the first conductivity type semiconductor layer, the active layer, and the second conductivity type layer stacked in that order is preferably employed. In other words, it is preferable to stack the n-type semiconductor layer, the active layer, and the p-type semiconductor layer, in that order. The p-type semiconductor layer side here is the side where the first elect and second electrode are disposed.

There are no particular restrictions on the type or material of semiconductor layer, but a nitride semiconductor material such as $In_XAl_YGa_{1-X-Y}N$ ($0 \le X$, $0 \le Y$, $X+Y \le 1$) can be used to advantage, for example.

The first conductivity type semiconductor layer and the second conductivity type semiconductor layer are formed on a substrate. Examples of the material for the substrate include an insulating substrate such as sapphire ($Al_2O_3$) and spinel ($MgAl_2O_4$), silicone carbide (SiC), ZnS, ZnO, Si, GaAs, diamond, and an oxide substrate such as lithium niobate and neodymium gallate which are capable of forming a lattice matching with the nitride semiconductor. The substrate used for growing the semiconductor layers may be removed from the semiconductor stack, The first conductivity type semiconductor layer and the second conductivity type semiconductor layer are such that the first electrode and second electrode (discussed below) are disposed on the same face side of the first conductivity type semiconductor layer and the second conductivity type semiconductor layer, so either the second conductivity type semiconductor layer is laminated on the first conductivity type semiconductor layer so as to expose part of the first conductivity type semiconductor layer, or the first conductivity type semiconductor layer is laminated on the second conductivity type semiconductor layer so as to expose part of the second conductivity type semiconductor layer.

In an embodiment, a semiconductor stack is constituted by laminating a p-type semiconductor layer via the active layer over an n-type semiconductor layer, and the p-type semiconductor layer and the active layer are partially removed so as to expose part of the n-type semiconductor layer beneath them.

There are no particular restrictions on the semiconductor stack that serves as the light emitting component of the light emitting element, but the plan view shape is preferably one having a pair of opposing sides, and a rectangular shape is more preferable. The corners, however, may be rounded off. With a rectangle, variation in the angle of the four corners of about 90±10 degrees is permissible. With a square, variation in the length of one side of about ±5% of the length of the other sides is permissible.

(First Electrode and Second Electrode)

The first electrode and the second electrode supply current to the first conductivity type semiconductor layer and the second conductivity type semiconductor layer, respectively, and are therefore directly or indirectly electrically connected to the first conductivity type semiconductor layer and the second conductivity type semiconductor layer.

The first electrode is an n side electrode if the first conductivity type semiconductor layer is n type, and the first electrode is a p side electrode if the first conductivity type semiconductor layer is p type. This is similar as to the second electrode.

In a plan view, the first electrode and the second electrode are arranged at the inner side of the light emitting element. In other words, it is preferred that the first electrode is surrounded by the second conductivity type semiconductor layer, or the second electrode is surrounded by the first conductivity type semiconductor layer. With this arrangement, electric current can be diffused all around the first electrode or the second electrode. Part of the first electrode or the second electrode may not be surrounded by the first conductivity type semiconductor layer or the second conductivity type semiconductor layer.

All or part of the first electrode may be surrounded by the second electrode, or vice versa. In other words, all or part of the n-side electrode may be surrounded by the p-side electrode, and all or part of the p-side electrode may be surrounded by the n-side electrode. The former is especially preferable when ensuring the proper surface area of the active layer is taken into account.

The first electrode and second electrode respectively have the first connecting portion and second connecting portion.

The first connecting portion and second connecting portion are so-called pad electrodes that are connected to external electrodes, external terminals, or the like to supply current to the light emitting element, and are portions where a conductive wire or the like is bonded, for example.

The first connecting portion and second connecting portion are eccentrically located on a pair of opposing sides of the semiconductor stack. In particular, when the plan view shape of the semiconductor stack is rectangular, the first connecting portion and second connecting portion are preferably disposed near the respective ends of a center line. This center line is a line parallel to one side of the plan view shape of the semiconductor stack, and is preferably a line passing through the center point of another side perpendicular to this one side. This center line will sometimes be referred to as the first center line. In this Specification, however, it is permissible for the center line, center point, and so forth to vary from about a few microns to a few dozen microns due to machining precision of the light emitting element and so forth.

The plan view shapes of the first connecting portion and the second connecting portion can be adjusted appropriately according to the size of the light emitting element and the arrangement of the electrodes etc., and for example, a circular shape, a polygonal shape, or the like, can be employed. Of those, in view of easiness of wire bonding, a circular shape or a shape similar to a circular shape is preferable. The size of the first connecting portion and the second connecting portion can be adjusted appropriately based on the size of the light emitting element, the arrangement of the electrodes, and the like, and their plan view shapes can be circular shapes having a diameter of about 70 to 150 μm respectively, for example. The first connecting portion and the second connecting portion may have different shapes and sizes, or the same shape and size.

The first electrode has a first extending portion and a second extending portion.

The second electrode has a third extending portion, and may optionally have a fourth extending portion.

There are no particular restrictions on the shapes or numbers of the first extending portion, the second extending portion, the third extending portion and the fourth extending portion, and they can be set at appropriate shapes and numbers.

In one embodiment, the first electrode preferably has the first extending portion that extends linearly from the first connecting portion toward the second connecting portion, and the two second extending portions that extend on two sides of (i.e., flanking) the first extending portion. The two second extending portions preferably extend on two sides of the first extending portion and parallel to the first extending portion.

The second electrode preferably has two third extending portions that extend parallel to the first extending portion between the first extending portion and the two second extending portions. The second electrode preferably has two fourth extending portions. The two fourth extending portions preferably extend on the outside of the third extending portions, and more preferably extend parallel to the first extending portion on the outside of the second extending portions.

The first extending portion and the second extending portions are linked to the first connecting portion, and the third extending portions and the optional fourth extending portions are linked to the second connecting portion. The first extending portion, the second extending portions, the third extending portions, and the optional fourth extending portions serve as auxiliary electrodes for uniformly diffusing the current supplied to the first connecting portion and second connecting portion to the semiconductor layers.

The first extending portion and the second extending portions preferably extend from the first connecting portion. The distal ends of these are preferably located more to the second connecting portion side than a line passing through the center point of another side and perpendicular to the first center line (this will sometimes be called the second center line).

In particular, as discussed above, in the case where the first connecting portion is disposed near one end of the first center line, it is preferable for the first extending portion to extend over the first center line.

The second extending portions preferably extend in a direction away from the first extending portion, then gradually or suddenly change direction and extend in a direction parallel to the first extending portion. Examples of a "direction away from the first extending portion" include a direction perpendicular to a direction parallel to the first extending portion, and a direction that the two second extending portions draws an arc or a parabola having its center in the side of the second connecting portion.

The third extending portions and fourth extending portions preferably extend from the second connecting portion. The distal ends of these are preferably located more to the first connecting portion side than a line passing through the center point of another side and perpendicular to the first center line (the second center line). In particular, the fourth extending portions preferably extend farther than the first connecting portion in a direction away from the second connecting portion.

The two third extending portions preferably extend so as to form a single U shape. This is because the distance is shorter than in the case where the bended shape is such that straight lines are linked up, the length of the extending portions can be shorter, and thus less blockage and absorption of light by the extending portions.

The two fourth extending portions preferably extend in a direction away from the third extending portions, then gradually or suddenly change direction and extend in a direction parallel to the first extending portion. Examples of a "direction away from the third extending portions" include a direction perpendicular to a direction parallel to the first extending portion, and a direction that draws an arc or a parabola having its center in the first connecting portion direction with the two fourth extending portions.

The second extending portions, the third extending portions, and the fourth extending portions all may be bent at their distal ends. "Bent at their distal ends" encompasses when the extending portions bend, and when they curve. The distal ends of the second extending portions, the third extending portions, and the fourth extending portions may bend toward the first connecting portion and/or the second connecting portion, or they may bend toward the inside of the semiconductor stack and/or the first center line of the semiconductor stack.

There are no particular restrictions on the width of the first extending portion, the second extending portions, the third extending portions, and the fourth extending portions, but it is preferable, for example, for the width to be about 5 to 30%, about 5 to 20%, or about 5 to 15% of the diameter or the maximum length of the first connecting portion and the second connecting portion. The widths of these extending portions may be different from one another, or may be the same. For instance, the first extending portion and the second extending portions preferably have the same width, and the third extending portions and the fourth extending portions preferably have the same width. Preferably, the first extending portion and the second extending portions, and the third extending portions and the fourth extending portions have mutually different widths. Also, the first extending portion, the second extending portions, the third extending portions, and the fourth extending portions may each have a width that varies from place to place, or the width may be constant.

In the case where the semiconductor stack is a square, there are no particular restrictions on the size of the square in plan view, but one side can be from 600 to 1200 μm. The size, length, width, and/or spacing of the first extending portion, the second extending portions, the third extending portions, and the fourth extending portions can be suitably adjusted according to the size of the semiconductor stack in plan view.

For example, in plan view, if the semiconductor stack measures 800 μm square, and the first connecting portion and the second connecting portion have a substantially circular shape with a diameter of about 100 μm, the first connecting portion and the second connecting portion can be separated by 420 to 660 μm. The overall length of the first extending portion can be suitably adjusted within a range of 190 to 370 μm, the overall length of the second extending portion can be suitably adjusted within a range of 750 to 1500 μm, the overall length of the third extending portion can be suitably adjusted within a range of 600 to 1100 μm, and the overall length of the fourth extending portion can be suitably adjusted within a range of 1300 to 2200 μm. The distances f and m between the distal ends of the third extending portions and the second extending portions in the direction in which the third extending portions are extended parallel to the first extending portion can be suitably adjusted within a range of 120 to 190 μm, the distances g and j between the distal ends of the second extending portions and the fourth extending portions in the direction in which the second extending portions are extended parallel to the first extending portion can be suitably adjusted within a range of 90 to 190 μm, and the distances h and k between the distal end of the first extending portion and the second connecting portion can be suitably adjusted within a range of 120 to 170 μm. The widths of the first extending portion, the second extending portions, the third extending portions, and the fourth extending portions can be within a range of about 2 to 15 μm.

In the case where the plan view shape of the semiconductor stack is rectangular, the first extending portion is preferably parallel to one side of the semiconductor stack. Similarly, each of the second extending portions, the third extending portions, and the fourth extending portions preferably has a part that is parallel to one side of the semiconductor stack. Such a layout of the extending portions allows the current supplied from the first connecting portion and second connecting portion to be uniformly diffused over the entire face of the semiconductor stack.

Figure 2A:
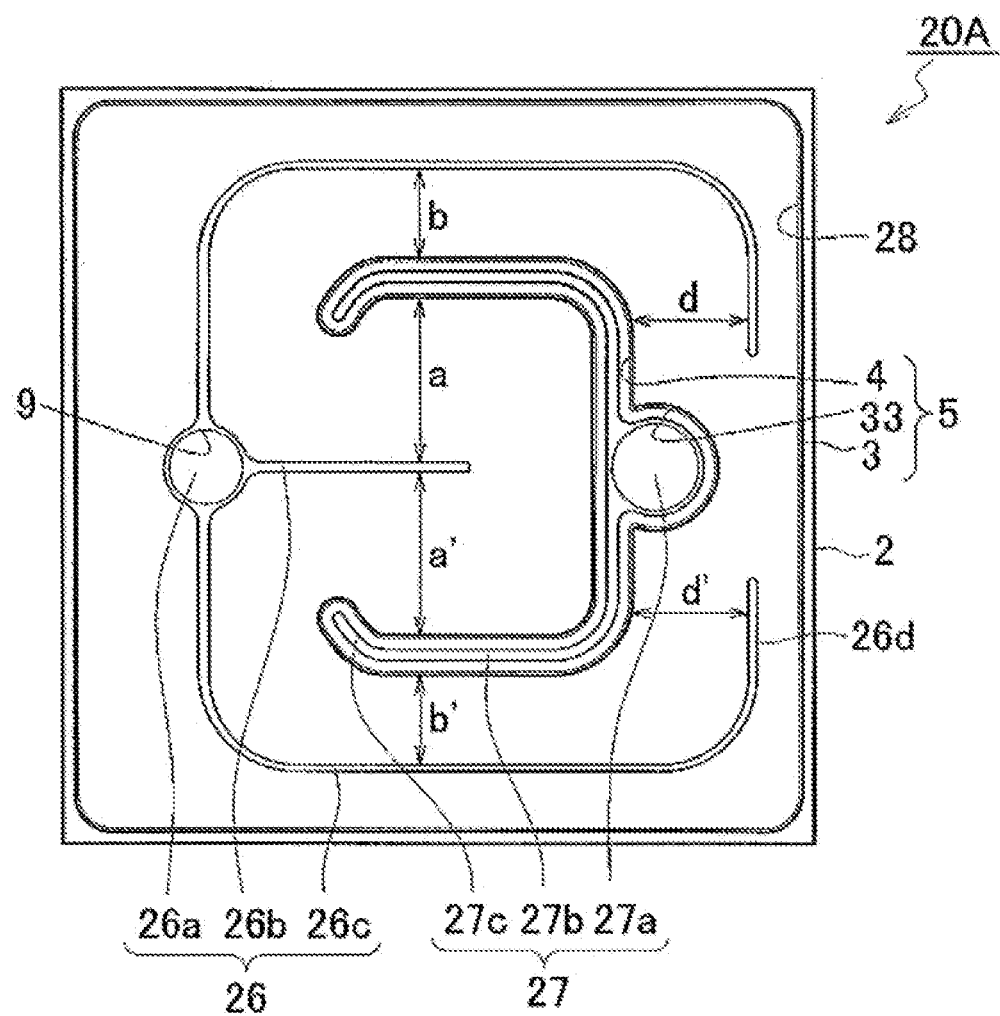
FIG. 2A is a plan view showing a light emitting element according to Example 2 of the present disclosure.

As shown in FIGS. 1A and 2A, the distances (b and b') between the second extending portions and the third extending portions are preferably shorter than the distances (a and a') between the first extending portion and the third extending portions. That is, the distances between the two second extending portions and the respectively adjacent two third extending portions in a direction perpendicular to the first extending portion are preferably shorter than the distances between the first extending portion and the adjacent two third extending portions.

The distances (a+b and a'+b') between the first extending portion and the two second extending portions are preferably equal.

The distances (a and a') between the first extending portion and the two third extending portions are preferably equal.

As shown in FIG. 1A, in the case where the light emitting element has fourth extending portions, the distances (c and c') between portions of the fourth extending portions extending parallel to the first extending portion and portions of the second extending portions extending parallel to the first extending portion in a direction perpendicular to the first extending portion are preferably shorter than the distances (b and b') between the second extending portions and the third extending portions, and the distances (c and c') are preferably shorter than the distances (a and a') between the first extending portion and the third extending portions.

Current tends to accumulate (electricity tends to flow) at the straight portion connecting the first connecting portion and second connecting portion. Accordingly, current tends to be diffused to the first extending portion and the two third extending portions near the straight portion connecting the first connecting portion and second connecting portion. Therefore, the accumulation of current can be suppressed by widening the spacing between the first extending portion and the third extending portions. On the other hand, at the area farther from the first connecting portion and the second connecting portion, that is, at the area the closer to the periphery of the semiconductor stack, the less the current tends to diffuse. Therefore, at the extending portions disposed around the periphery of the semiconductor stack, current diffusion is promoted more by narrowing the spacing between the adjacent extending portions. That is, the order, starting from the spacing with the greatest distance, is preferably the distance (a and a') between the first extending portion and the third extending portions, the distance (b and b') between the second extending portions and the third extending portions, and the distance (c and c') between the fourth extending portions and the second extending portions. Disposing the extending portions in this way reduces unevenness in the current density distribution of the semiconductor stack.

The a and a' distances between the first extending portion and the two third extending portions may be different from one another. Also, in a direction perpendicular to the first extending portion, the b and b' distances between the adjacent second extending portions and third extending portions may be different from one another. Furthermore, in a direction perpendicular to the first extending portion, the c and c' distances between the adjacent fourth extending portions and second extending portions may be different from one another.

As shown in FIG. 1A, in the case where the distal ends of the fourth extending portions are bent, the distance (e and e') between the distal ends of the fourth extending portions and the second extending portions in the extending direction of the first extending portion is preferably longer than the distance (c and c') between portions of the fourth extending portions extending parallel to the first extending portion and portions of the second extending portions extending parallel to the first extending portion in a direction perpendicular to the first extending portion.

This lessens the tendency for current to accumulate between the first connecting portion and the distal ends of the fourth extending portions, and allows the current to be uniformly diffused over the entire face of the semiconductor stack.

The e and e' distances between the distal ends of the fourth extending portions and the second extending portions in the extending direction of the first extending portion may be different from one another.

As shown in FIG. 2A, in the case where the distal ends of the second extending portions are bent, the distance (d and d') between the distal ends of the second extending portions and the third extending portions in the extending direction of the first extending portion is preferably longer than the distances (b and b') between portions of the second extending portions extending parallel to the first extending portion and portions of the third extending portions extending parallel to the first extending portion in a direction perpendicular to the first extending portion.

This lessens the tendency for current to accumulate between the second connecting portion and the distal ends of the second extending portions, and allows the current to be uniformly diffused over the entire face of the semiconductor stack.

The d and d' distances between the distal ends of the second extending portions and the third extending portions in the extending direction of the first extending portion may be different from one another.

The first electrode and second electrode are preferably such that a light-transmissive conductive layer that covers substantially the entire surface of the first conductivity type semiconductor layer or the second conductivity type semiconductor layer is further disposed between the electrodes and the semiconductor stack, as discussed below. The light-transmissive conductive layer may be provided on both the first conductivity type semiconductor layer and the second conductivity type semiconductor layer. The term "substantially the entire surface" here means a surface area of at least 90% or about 95% of the total surface area of the second conductivity type semiconductor layer. When the light-transmissive conductive layer is formed, an insulating film may be formed under the first electrode or the second electrode, and in at least part between the light-transmissive conductive layer and the first conductivity type semiconductor layer or the second conductivity type semiconductor layer. This insulating film makes it less likely that light will hit the first electrode and the second electrode and be absorbed.

The first electrode and the second electrode are generally arranged such that a planar dimension of a rectangular shape enclosing the outer edge of the first electrode or the second electrode, is preferably 60 to 90%, more preferably 70 to 90% with respect to the planar dimension of the light-transmissive conductive layer or the semiconductor stack to be described below. With this arrangement, electric current can be supplied uniformly on approximately the entire surface of the semiconductor stack. In addition, the planar dimension of the electrodes (the first electrode and the second electrode) occupying the upper surface of the semiconductor stack can be reduced, so that absorption of light by the electrodes can be reduced, thus, deterioration in the light extraction efficiency can be reduced.

Particularly, the rectangular shape enclosing the outer edge of the first electrode or the second electrode is preferably a similar shape or an approximately similar shape as the external shape of the light emitting element or the external shape of the second conductivity type semiconductor layer, with a size scaling down toward the gravity point of the light emitting element. With the shape as described above, more uniform supply of electric current can be realized. "Rectangular shape enclosing the outer edge of the first electrode and the second electrode" refers to a rectangular shape which is in contact with the end portions arranged outermost side of the first electrode and the second electrode, and is enclosed by lines substantially parallel with the periphery of the light emitting element or the second conductivity type semiconductor layer. Also, in the specification, with "approximately similar shape", variation in scale reduction of one or more sides with respect to other sides of about ±10% is permissible.

For the first electrode and the second electrode, for example, a single-layer or a multi-layer of metal or alloy of Ni, Rh, Cr, Au, W, Pt, Ti, Al, etc., can be used, and of those, a multi-layer of Ti/Pt/Au, Ti/Rh/Au, or the like, respectively stacked in this order is preferably used.

In one embodiment, the first electrode has a first connecting portion that is provided near one end of a center line, and a plurality of extending portions (namely, a first extending portion and second extending portions) having parts that extend parallel to the center line. The second electrode has a second connecting portion that is provided on the other side of the center line where the first connecting portion is located, and a plurality of extending portions (namely, third extending portions and, optionally, fourth extending portions) having parts that extend parallel to the center line. The first extending portion, the second extending portions, the third extending portions, and the optional fourth extending portions are disposed alternately in another center line direction that is perpendicular to the center line. The distance between the adjacent first extending portion, second extending portions, third extending portions, and optional fourth extending portions decreases toward the side closer to the outer periphery of the semiconductor stack.

(Conductive Layer)

The conductive layer disposed between the first electrode or the second electrode and the semiconductor stack is for supplying the electric current supplied from the first electrode or the second electrode uniformly into the entire surface of the semiconductor stack. A metal thin layer can be used for the conductive layer, but as the conductive layer is disposed at the light extracting surface-side of the light emitting element, a light-transmissive conductive layer, more specifically, a conductive oxide layer is preferably used. Examples of the conductive oxide include an oxide containing at least one selected from the group having of Zn, In, Sn, and Mg, and more specifically, ZnO, $In_2O_3$, $SnO_2$, ITO (Indium Tin Oxide; ITO), IZO (Indium Zinc Oxide), GZO (Gallium doped Zinc Oxide) and the like. The conductive oxide (in particular, ITO) is a material which exhibits high light transmissivity (for example, 60% or greater, 70% or greater, 75% or greater, or 80% or greater) to visible light (in the visible light region) and has a relatively high electric conductivity, so that can be used preferably.

(Packaging)

The light emitting element can be mounted on a base member and enclosed with a sealing member to constitute a light emitting device. The light emitting element can be mounted either in a face-up manner or in a face-down manner.

The base member is generally constituted with a wiring and an insulating material. The wiring is used to supply electric power to the electrode of the light emitting element. For this purpose, any electrically conductive materials which can serve this function can be used. As for such materials, appropriate materials can be selected from materials described above used for the first electrode etc. Examples of the insulating materials include ceramics, resins, dielectric materials, pulps, glass or composite materials of those, or complex materials of those materials and conductive materials (for example, metal, carbon, etc).

The wiring and the insulating material may be formed integrally in an approximately rectangular parallelepiped shape or an approximately cuboid shape, and a recess may be formed in any portion for mounting the light emitting element.

The sealing member is used to protect the light emitting element and the connecting members such as a wire from external environment, and any materials which allow efficient extraction of light from the light emitting element can be employed for the sealing member. For example, a light transmissive resin can be employed. The light transmissive resin can contain fluorescent materials, light diffusion materials, fillers and the like.

The light transmissive resin allows penetration of light, which is 60% or greater of light emitted from the light emitting layer, and further preferably allows penetration of 70% or greater, 80% or greater, or 90% or greater of light emitted from the light emitting layer. Examples of such resin include a silicone resin, an epoxy resin, and the like.

The fluorescent materials known in the art may be employed. For example, in the case where a gallium nitride based light emitting element to emit blue light is used as the light emitting element, fluorescent materials to absorb blue light, such as a YAG-based fluorescent material or a LAG-based fluorescent material to emit yellow to green light, a SiAlON-based fluorescent material (β-sialon-based fluorescent material) to emit green light, and a SCASN-based fluorescent material and a CASN-based fluorescent material to emit red light, can be used singly or in combination. Further, fluoride fluorescent materials, whose excitation band is in blue region and which is red light emitting fluorescent materials having narrow half bandwidth of the emission peak, such as $K_2SiF_6:Mn^{4+}$, $K_2TiF_6:Mn^{4+}$, $K_2SnF_6:Mn^{4+}$, $Na_2TiF_6:Mn^{4+}$, $Na_2ZrF_6:Mn^{4+}$, $K_2Si_{0.5}Ge_{0.5}F_6:Mn^{4+}$.

Examples of the light emitting element of the present disclosure will now be described in detail through reference to the drawings.

EXAMPLE 1

Figure 1B:
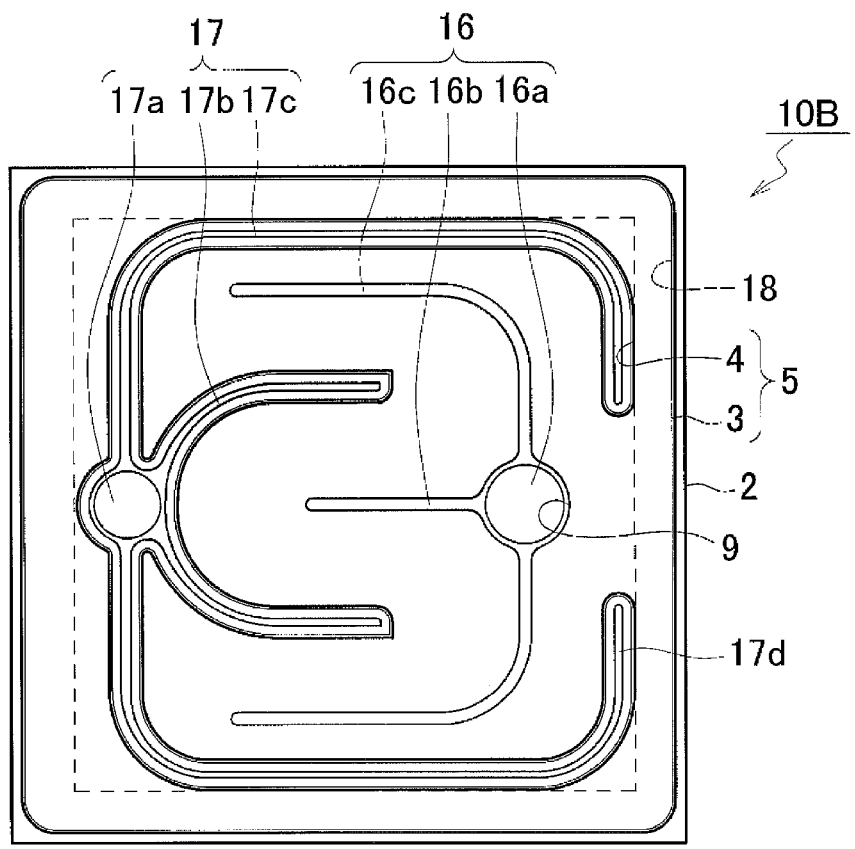
FIG. 1B is a plan view showing a Modification Example 1 of the light emitting element according to Example 1 of the present disclosure.
Figure 1C:
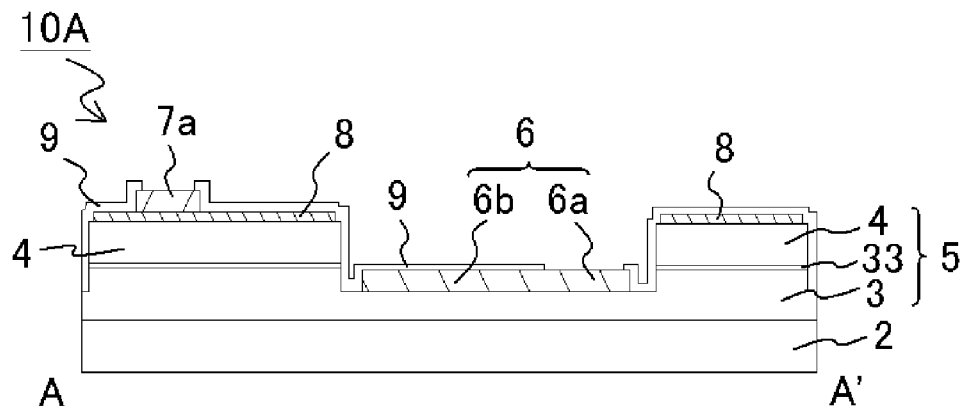
FIG. 1C is a schematic cross-sectional view showing the light emitting element according to Example 1 of the present disclosure.

As shown in FIGS. 1A and 1C, the light emitting element 10A in Example 1 has a substrate 2, a semiconductor stack 5 having an n-type semiconductor layer 3 (a first conductivity type semiconductor layer), an active layer 33, and a p-type semiconductor layer 4 (a second conductivity type semiconductor layer) provided in that order over the substrate 2, an n-side electrode (a first electrode 6) formed on the n-type semiconductor layer 3, and a p-side electrode (a second electrode 7) that is disposed on the p-type semiconductor layer 4 and surrounding the n-side electrode.

The substrate 2 and the semiconductor stack 5 (in particular, the p-type semiconductor layer 4) has an approximately square shape in a plan view, the length of a side of the semiconductor stack 5 or the substrate 2 is 800 μm.

The first electrode 6 (the n-side electrode) is formed on the n-type semiconductor layer 3 at the part of the semiconductor stack 5 exposed by removing part of the p-type semiconductor layer 4 and the active layer 33, and is electrically connected to the n-type semiconductor layer 3. The first electrode 6 (the n-side electrode) is surrounded by the p-type semiconductor layer 4 and the active layer 33.

The second electrode 7 (the p-side electrode) is formed on the p-type semiconductor layer 4. A light-transmissive conductive layer 8, which is formed over substantially the entire surface of the p-type semiconductor layer 4, is disposed between the p-type semiconductor layer 4 and the second electrode 7 (the p-side electrode). The second electrode 7 (the p-side electrode) is electrically connected to the p-type semiconductor layer 4 via the conductive layer 8.

The semiconductor stack 5, the n-side electrode, and the p-side electrode are covered by a protective film 9, except at a part of a first connecting portion 6a and a part of a second connecting portion 7a (discussed below).

The first electrode 6 (the n-side electrode) and the second electrode 7 (the p-side electrode) respectively have the first connecting portion 6a and the second connecting portion 7a, which are electrically connected to an external circuit. The first connecting portion 6a and the second connecting portion 7a are disposed near the respective ends of a first center line of the semiconductor stack 5. This first center line is parallel to one side of the semiconductor stack 5 in the plan view, and passes through the center point of another edge that is perpendicular to this first edge. The first connecting portion 6a and the second connecting portion 7a are substantially circular, with a diameter of about 100 μm. The distance between the first connecting portion 6a and the second connecting portion 7a (between center points) is 473 μm.

The first electrode 6 (the n-side electrode) has a first extending portion 6b that extends in a straight line from the first connecting portion 6a toward the second connecting portion 7a, and two second extending portions 6c that extend from the first connecting portion 6a parallel to the first extending portion 6b on two sides of (flanking) the first extending portion 6b. The first extending portion 6b extends over the first center line and parallel to one side of the semiconductor stack 5.

The first extending portion 6b and the second extending portions 6c have substantially the same width, which is 12 μm. The total length of the first extending portion 6b is 215 μm. The total length of the second extending portions 6c is 1100 µm, and the straight line part of the second extending portions 6c parallel to the first extending portion 6b is about 470 µm.

The second electrode 7 (the p-side electrode) has two third extending portions 7b that extend parallel to the first extending portion 6b, in between the first extending portion 6b and the two second extending portions 6c. Also, the second connecting portion 7a further has fourth extending portions 7c that extend parallel to the first extending portion 6b, on the outside of the second extending portions 6c. The distal ends 7d of these fourth extending portions 7c are bent toward the first connecting portion 6a.

The width of the third extending portions 7b is 8 µm. The width of the fourth extending portions 7c decreases as distance from the second connecting portion increases, and is 10 µm at one part and 6 µm at another. The total length of the third extending portions 7b is 666 µm, and the straight line part of the third extending portions parallel to the first extending portion 6b is about 235 µm. The total length of the fourth extending portions 7c is 1940 µm, and the straight line part of the fourth extending portions parallel to the first extending portion 6b is about 760 µm.

The distances a and a' between the first extending portion 6b and the two third extending portions 7b are the same, at 130 µm. The distance f between the distal ends of the third extending portions 7b and the second extending portions 6c in the direction in which the third extending portions 7b are extended parallel to the first extending portion 6b is 166 µm.

The distances b and b' between the third extending portions 7b and the second extending portions 6c are the same, at 102 µm.

The distances c and c' between the second extending portions 6c and the fourth extending portions 7c are the same, at 60 µm.

The distances e and e' between the distal ends 7d of the fourth extending portions 7c and the second extending portions 6c are the same, at 91 µm.

The distances g between the distal ends of the second extending portions 6c and the fourth extending portions 7c in the direction in which the second extending portions 6c are extended parallel to the first extending portion 6b is 104 µm.

The distance h between the distal end of the first extending portion 6b and the second connecting portion 7a is 152 µm.

Therefore, the distances b and b' between the second extending portions 6c and the third extending portions 7b are shorter than the distances a and a' between the first extending portion 6b and the third extending portions 7b.

The distances c and c' between portions of the fourth extending portions extending parallel to the first extending portion and portions of the second extending portions extending parallel to the first extending portion in a direction perpendicular to the first extending portion are shorter than the distances b and b' between the second extending portions 6c and the third extending portions 7b.

The distances c and c' are shorter than the distances a and a' between the first extending portion 6b and the two third extending portions 7b.

The distances c and c' are shorter than the distances e and e' between the distal ends 7d of the fourth extending portions 7c and the second extending portions 6c.

In the light emitting element 10A, the second electrode 7 which is a p-side electrode surrounding the first electrode 6 which is an n-side electrode is arranged in a region with a scale of about 70% with respect to the planar dimension of the conductive layer 8 centered at the center of the semiconductor stack 5. In other words, when assuming four straight lines which are respectively in contact with the end portions at outermost sides of the second electrode 7, and in parallel with the four outer edges of the semiconductor stack 5, the planar dimension surrounded with the four straight lines has a scale ratio of approximately 70% with respect to the planar dimension of the conductive layer 8 (see, an area enclosed by dotted line in FIG. 1A).

Modification Example 1 of Example 1

As shown in FIG. 1B, the light emitting element 10B of this Modification Example 1 of Example 1 has substantially the same configuration as the light emitting element 10A in Example 1, except that the first electrode 16 is the p-side electrode, and the second electrode 17 is the n-side electrode.

That is, the light emitting element 10B has a first electrode 16 as the p-side electrode, which has a first connecting portion 16a, a first extending portion 16b, and two second extending portions 16c. The the light emitting element 10B has a second electrode 17 as the n-side electrode, which has a second connecting portion 17a, two third extending portions 17b, and two fourth extending portions 17c. The distal ends 17d of these fourth extending portions 17c are bent toward the first connecting portion 16a.

The width of the first extending portion 16b is 12 µm.
The width of the second extending portion 16c is 12 µm.
The width of the third extending portion 17b is 8 µm.
The width of the fourth extending portions 17c is 10 µm at a place near the second connecting portion 17a, and 6 µm at the distal end side.

Modification Example 2 of Example 1

Figure 1D:
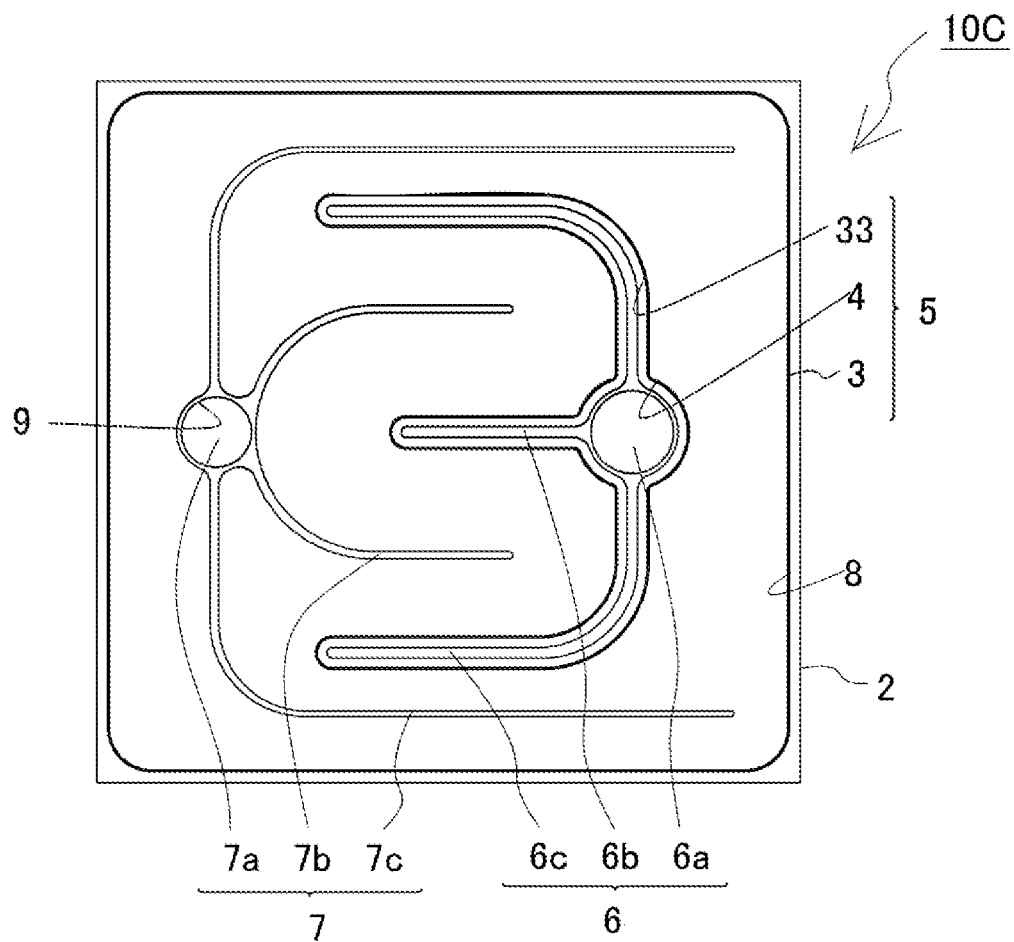
FIG. 1D is a plan view showing another Modification Example of the light emitting element according to Example 1 of the present disclosure.

As shown in FIG. 1D, the light emitting element 10C of this Modification Example 2 of Example 1 is similar to the light emitting element 10A in that the second connecting portion 7a, the third extending portions 7b, and the fourth extending portions 7c are disposed at the second electrode 7, and has substantially the same configuration as the light emitting element 10A in Example 1 except that the distal ends of the fourth extending portions 7c are not bent, and extend linearly toward the end of the light emitting element 10C, past the outermost end of the first connecting portion 6a.

The distance between the distal ends of the fourth extending portions 7c near the end of the light emitting element and the end of the semiconductor stack 5 in the direction in which the fourth extending portions 7c extend parallel to the first extending portion 6b is 62 µm.

EXAMPLE 2

As shown in FIG. 2A, the light emitting element 20A in this Example 2 has a substrate 2, a semiconductor stack 5 having an n-type semiconductor layer 3 (a first conductivity type semiconductor layer), an active layer 33, and a p-type semiconductor layer 4 (a second conductivity type semiconductor layer) provided in that order over the substrate 2, an n-side electrode (a second electrode 27) formed on the n-type semiconductor layer 3, and an p-side electrode (a first electrode 26) that is disposed on the p-type semiconductor layer 4 and surrounding the n-side electrode (the second electrode 27).

The substrate 2 and the semiconductor stack 5 (in particular, the p-type semiconductor layer 4) have an approximately square shape in a plan view. For example, the length of a side of the semiconductor stack 5 or the substrate 2 is 800 μm.

The second electrode 27 (the n-side electrode) is formed on the n-type semiconductor layer 3 at the part of the semiconductor stack 5 exposed by removing part of the p-type semiconductor layer 4 and the active layer 33, and is electrically connected to the n-type semiconductor layer 3. The second electrode 27 (the n-side electrode) is surrounded by the p-type semiconductor layer 4 and the active layer 33.

The first electrode 26 (the p-side electrode) is formed on the p-type semiconductor layer 4. A light-transmissive conductive layer 28, which is formed over substantially the entire surface of the p-type semiconductor layer 4, is disposed between the p-type semiconductor layer 4 and the first electrode 26 (the p-side electrode). The first electrode 26 (the p-side electrode) is electrically connected to the p-type semiconductor layer 4 via the conductive layer 28.

The semiconductor stack 5, the n-side electrode, and the p-side electrode are covered by a protective film 9, except at a part of a first connecting portion 26*a* and a part of a second connecting portion 27*a* (discussed below).

The first electrode 26 (the p-side electrode) and the second electrode 27 (the n-side electrode) respectively have the first connecting portion 26*a* and the second connecting portion 27*a*. The first connecting portion 26*a* and the second connecting portion 27*a* are disposed near the respective ends of a first center line of the semiconductor stack 5.

The first electrode 26 (the p-side electrode) has a first extending portion 26*b* that extends in a straight line from the first connecting portion 26*a* toward the second connecting portion 27*a*, and two second extending portions 26*c* that extend from the first connecting portion 26*a* parallel to the first extending portion 26*b* on two sides of (flanking) the first extending portion 26*b*. The first extending portion 26*b* extends over the first center line and parallel to one side of the semiconductor stack 5. The first extending portion has the width of 12 μm. The width of the second extending portions 26*c* decreases moving away from the first connecting portion 26*a*, and is 10 μm at one part and 6 μm at another. The total length of the first extending portion 26*b* is 248 μm. The total length of the second extending portions 26*c* is 1760 μm, and the straight line part parallel to the first extending portion 26*b* is about 880 μm.

The distal ends 26*d* of these second extending portions 26*c* are bent toward the second connecting portion 27*a*.

The second electrode 27 (the n-side electrode) has two third extending portions 27*b* that extend parallel to the first extending portion 26*b*, in between the first extending portion 26*b* and the two second extending portions 26*c*. The third extending portions 27*b* have distal ends 27*c* which are bent toward the first connecting portion 26*a*.

The width of the the third extending portions 27*b* is 8 μm. The total length of the third extending portion 27*b* is 666 μm, and the straight line part parallel to the first extending portion 26*b* is about 324 μm.

The distances a and a' between the first extending portion 26*b* and the two third extending portions 27*b* are the same, at 130 μm.

The distances b and b' between the third extending portion 27*b* and the second extending portion 26*c* are the same, at 61.5 μm.

The distances d and d' between the distal ends 26*d* of the second extending portions 26*c* and the third extending portions 27*b* are the same, at 112 μm.

In this light emitting element 20A, the first electrode 26 surrounding the the second electrode 27 is arranged in a region with a scale reduction of about 70% with respect to the planar dimension of the conductive layer 28 centered at the center of the semiconductor stack 5.

The light emitting element in this Example has substantially the same configuration as the light emitting element in Example 1 except for the above.

Modification Example 1 of Example 2

Figure 2B:
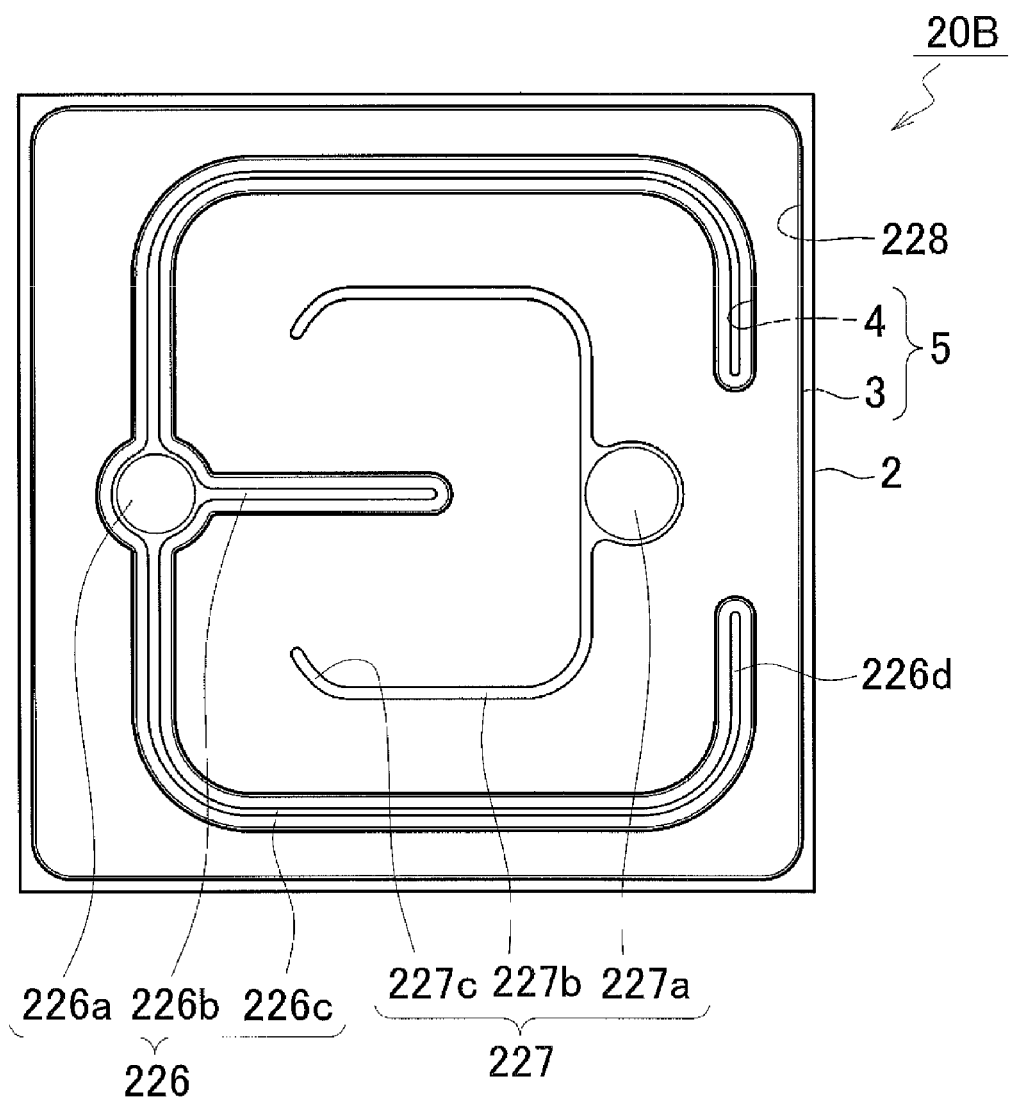
FIG. 2B is a plan view showing a Modification Example of the light emitting element according to Example 2 of the present disclosure.

As shown in FIG. 2B, the light emitting element 20B of this Modification Example 1 of Example 2 has substantially the same configuration as the light emitting element 20A in Example 2, except that the second electrode 227 is the p-side electrode, and the first electrode 226 is the n-side electrode.

That is, the light emitting element 20B has a first electrode 226 as the n-side electrode which has a first connecting portion 226*a*, a first extending portion 226*b*, and two second extending portions 226*c*. The distal ends 226*d* of these second extending portions 226*c* are bent toward the second connecting portion 227*a*. The light emitting element 20B has a second electrode 227 as the p-side electrode, which has a second connecting portion 227*a*, and two third extending portions 227*b*. The distal ends 227*c* of these third extending portions 227*b* are bent toward the first connecting portion 226*a*.

The width of the first extending portion 226*b* is 10 μm.

The width of the second extending portion 226*c* decreases moving away from the first connecting portion 226*a*, and is 10 μm at one part and 6 μm at another.

The width of the third extending portion 227*b* is 8 μm.

EXAMPLE 3

Figure 3:
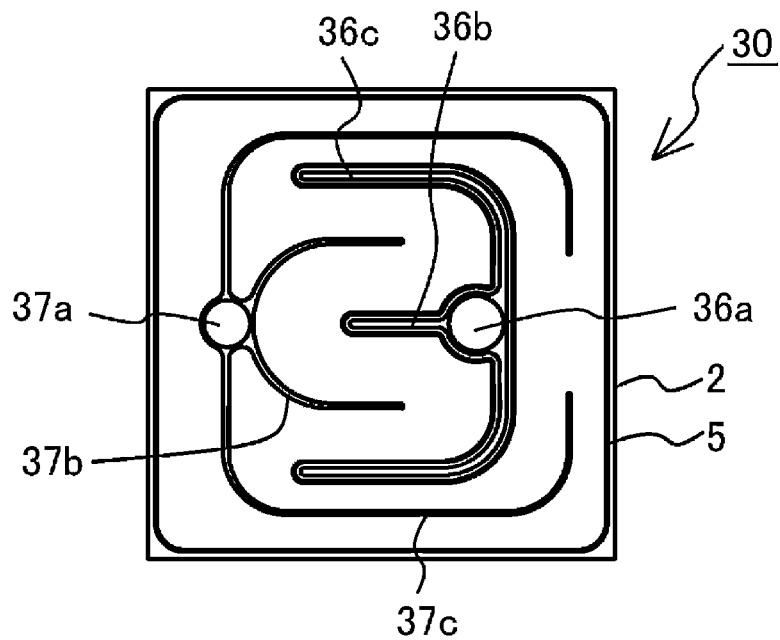
FIG. 3 is a plan view showing a light emitting element according to Example 3 of the present disclosure.

As shown in FIG. 3, the light emitting element 30 in this Example 3 has substantially the same configuration as the light emitting element 10A in Example 1, except that a first connecting portion 36*a* of the n-side electrode (the first electrode) is moved in the direction toward a second connecting portion 37*a* of the p-side electrode (the second electrode), which is accompanied by a slight change in how a first extending portion 36*b* and second extending portions 36*c* extend from the first connecting portion 36*a*.

EXAMPLE 4

Figure 4:
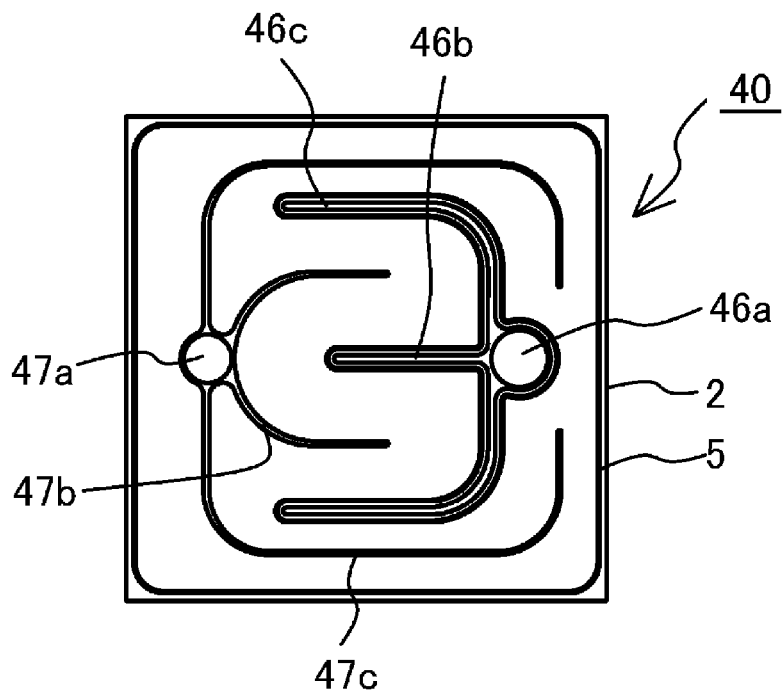
FIG. 4 is a plan view showing a light emitting element according to Example 4 of the present disclosure.

As shown in FIG. 4, the light emitting element 40 in this Example 4 has substantially the same configuration as the light emitting element 10A in Example 1, except that a first connecting portion 46*a* of the n-side electrode is moved in the direction toward the opposite side from a second connecting portion 47*a* of the p-side electrode, which is accompanied by a slight change in how a first extending portion 46*b* and second extending portions 46*c* extend from the first connecting portion 46*a*.

EXAMPLE 5

Figure 5:
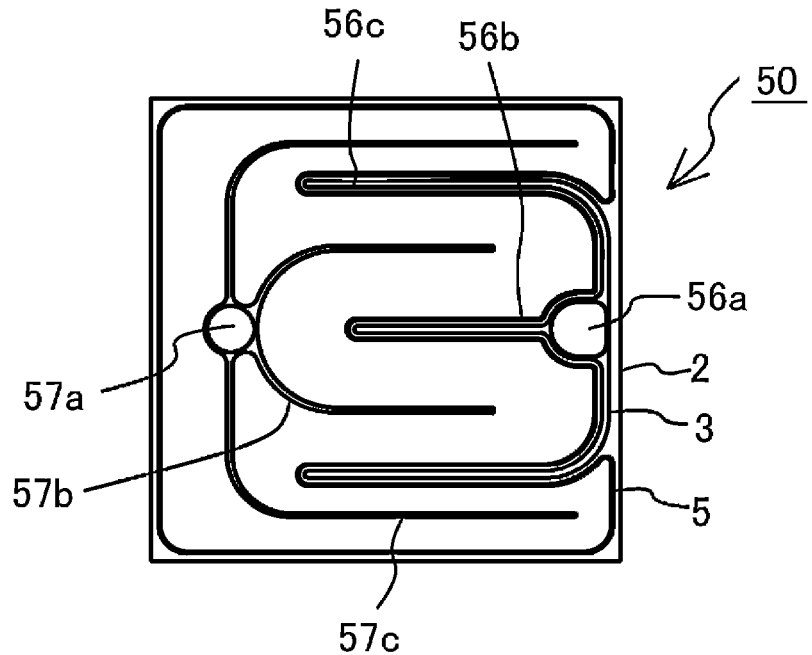
FIG. 5 is a plan view showing a light emitting element according to Example 5 of the present disclosure.

As shown in FIG. 5, the light emitting element 50 in this Example 5 is such that a first connecting portion 56*a* (the n-side electrode) is moved so as to come into contact with the nearest side of the semiconductor stack 5 in the plan view. Consequently, the distance between the first connecting portion 56*a* and a second connecting portion 57*a* is extended from the 473 μm of Example 1 to 593 μm.

The length of the first extending portion 56*b* and the second extending portions 56*c* is increased so that the distance between the second connecting portion 57*a* and the distal end of the first extending portion 56b, and the distance between the distal end of the second extending portions 56c and the fourth extending portions 57c in the direction in which the second extending portions 56c extend parallel to the first extending portion 56b will be the same as the distance between these members in the light emitting element 10A. In particular, the total length of the first extending portion 56b is 335 μm, and the total length of the second extending portions 56c is 1300 μm.

Also, the length of the third extending portions 57b and the fourth extending portions 57c are extended toward the one side of the semiconductor stack 5 where the first connection portion 56a comes into contact. In particular, the total length of the third extending portions 57b is 978 μm, and the total length of the fourth extending portions 57c is 1612 μm. The distance between the distal ends of the third extending portions 57b and the second extending portions 56c touching one edge of the semiconductor stack 5 is 174 μm. The distance between the distal ends of the fourth extending portions 57c and one edge of the semiconductor stack 5 is 62 μm.

EXAMPLE 6

Figure 6:
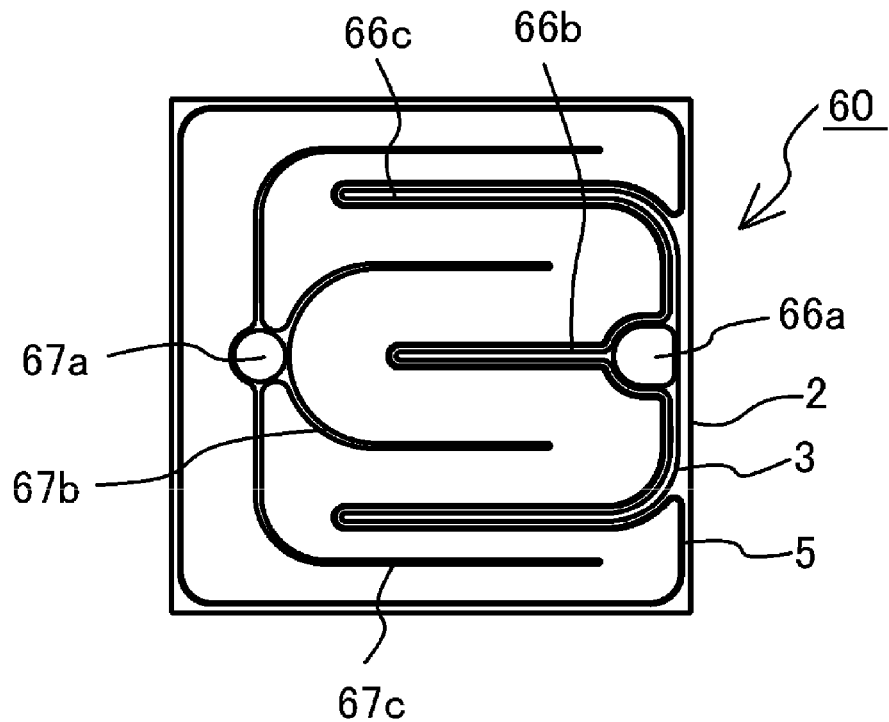
FIG. 6 is a plan view showing a light emitting element according to Example 6 of the present disclosure.

As shown in FIG. 6, the light emitting element 60 in this Example 6 is such that a first connecting portion 66a (the n-side electrode) is moved so as to come into contact with the nearest side of the semiconductor stack 5 in the plan view. Consequently, the distance between the first connecting portion 66a and a second connecting portion 67a is extended from the 473 μm of Example 1 to 593 μm.

The length of the first extending portion 66b and the second extending portions 66c is increased so that the distance between the second connecting portion 67a and the distal end of the first extending portion 66b, and the distance between the distal end of the second extending portions 66c and the fourth extending portions 67c in the direction in which the second extending portions 66c extend parallel to the first extending portion 66b will be the same as the distance between these members in the light emitting element 10A. In particular, the total length of the first extending portion 66b is 335 μm, and the total length of the second extending portions 66c is 1300 μm, Also, the length of the third extending portions 67b and the fourth extending portions 67c are extended to the one edge side of the semiconductor stack 5 where the first extending connection portion 66a comes into contact. In particular, the total length of the third extending portions 67b is 978 μm, and the total length of the fourth extending portions 67c is 1486 μm. The distance between the distal ends of the third extending portions 67b and the second extending portions 66c touching one edge of the semiconductor stack 5 is 174 μm. The distance between the distal ends of the fourth extending portions 67c and one edge of the semiconductor stack 5 is 125 μm.

EXAMPLE 7

Figure 7:
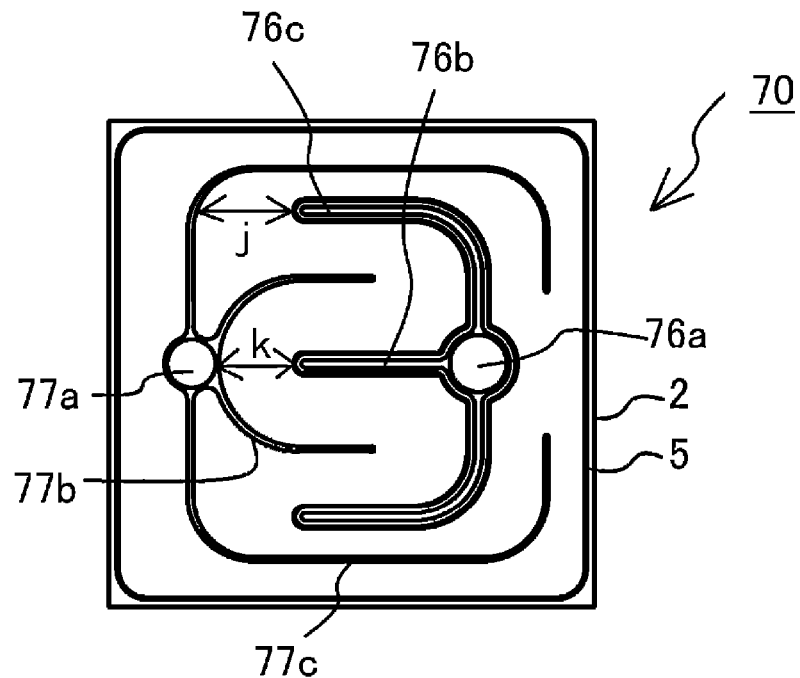
FIG. 7 is a plan view showing a light emitting element according to Example 7 of the present disclosure.

As shown in FIG. 7, the light emitting element 70 in this Example 7 has substantially the same configuration as the light emitting element 10A in Example 1, except that the total length of the second extending portions 76c is shorter (total length: 832 μm), the distance between the distal ends of the second extending portions 76c and the fourth extending portions 77c in the direction in which the second extending portions 76c extend parallel to the first extending portion 76b is longer (distance j: 172 μm), the first extending portion 76b is longer, and the distance between the first extending portion 76b and the second connecting portion 77a is shorter (distance k: 136 μm).

EXAMPLE 8

Figure 8:
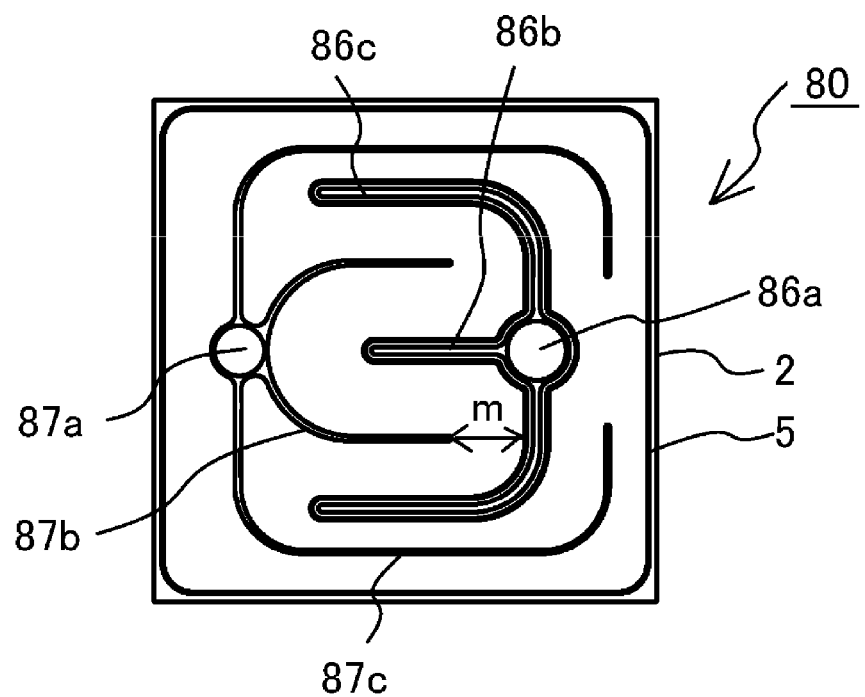
FIG. 8 is a plan view showing a light emitting element according to Example 8 of the present disclosure.

As shown in FIG. 8, the light emitting element 80 in this Example 8 has substantially the same configuration as the light emitting element 10A in Example 1, except that the total length of the third extending portions 87b is longer (total length: 760 μm), the distance between the distal ends of the third extending portions 87b and the second extending portions 86c in the direction in which the third extending portions 87b extend parallel to the first extending portion 86b is shorter (distance j: 130 μm).

EXAMPLE 9

Figure 9:
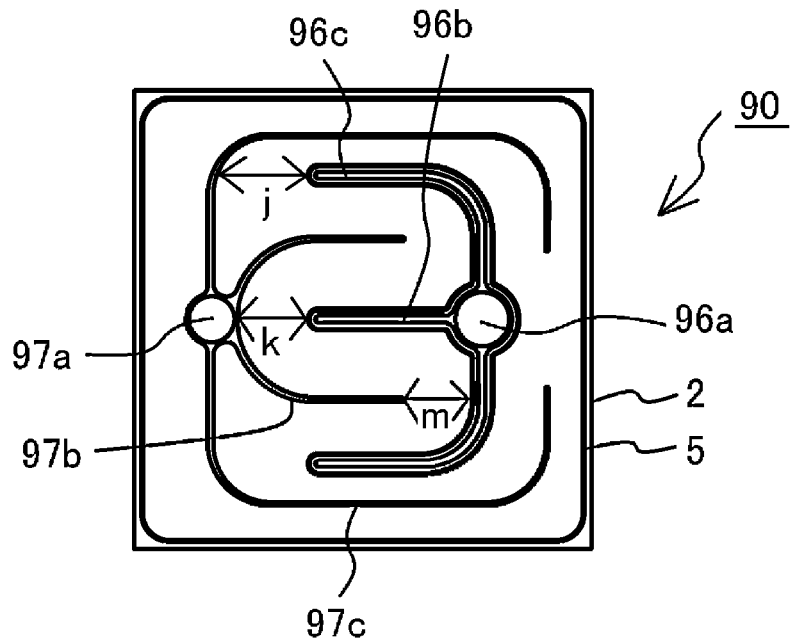
FIG. 9 is a plan view showing a light emitting element according to Example 9 of the present disclosure.

As shown in FIG. 9, the light emitting element 90 in this Example 9 has substantially the same configuration as the light emitting element 10A in Example 1, except that the total length of the second extending portions 96c is shorter (total length: 832 μm), the distance between the distal ends of the second extending portions 96c and the fourth extending portions 97c in the direction in which the second extending portions 96c extend parallel to the first extending portion 96b is longer (distance j: 172 μm), the first extending portion 96b is longer, the distance between the first extending portion 96b and the second connecting portion 97a is shorter (distance k: 136 μm), the total length of the third extending portions 97b is longer (total length: 760 μm), and the distance between the distal ends of the third extending portions 97b and the second extending portions 96c in the direction in which the third extending portions 97b extend parallel to the first extending portion 96b is shorter (distance m: 130 μm).

Reference Example

Figure 10:
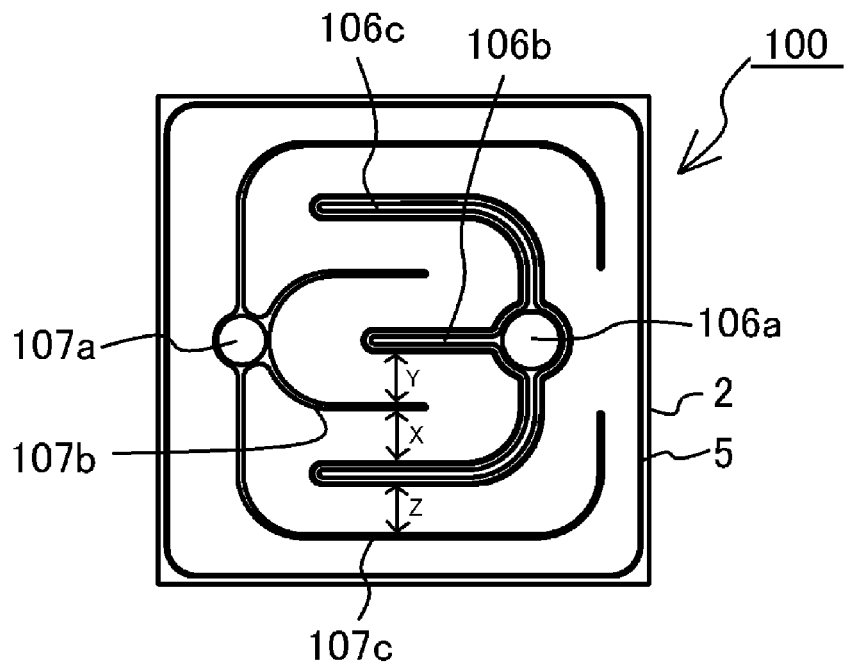
FIG. 10 is a plan view showing a light emitting element according to reference.

As shown in FIG. 10, the light emitting element 100 in this reference example has substantially the same configuration as in Example 1, except that the distance X between the second extending portions 106c and the third extending portions 107b is equal to the distance Y between the first extending portion 106b and the third extending portions 107b, and the distance Z between the second extending portions 106c and the fourth extending portions 107c. X=Y=Z=99 μm.

Evaluation of Light Emitting Elements

Figure 11:
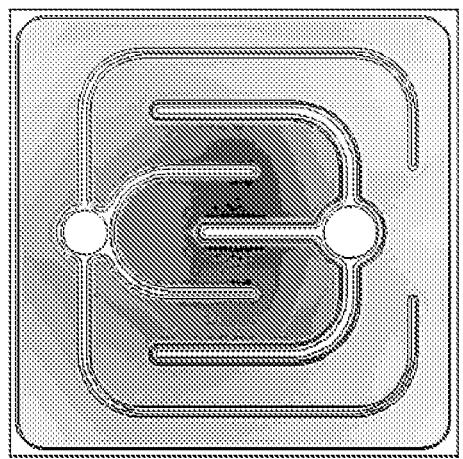
FIG. 11 is schematic plan views showing distribution of current density of light emitting elements according to Example 1, 5 and 8 and reference.
Figure 11:
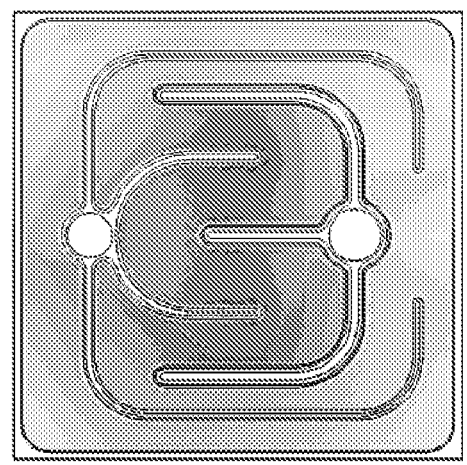
Figure 11:
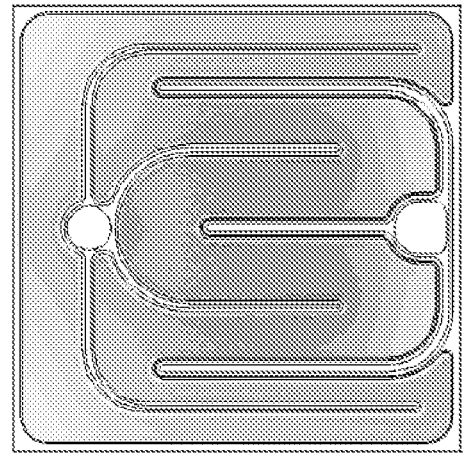
Figure 11:
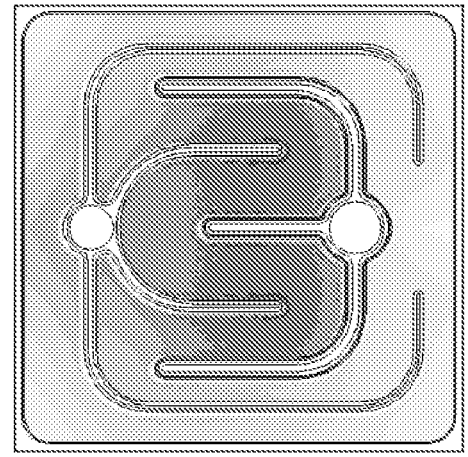

The distribution of current density in the light emitting elements 10A, 50, 80 of Examples 1, 5, 8 and the light emitting element 100 of Reference Example was analyzed by using simulation software based on the finite element method. The results are shown in FIG. 11. In FIG. 11, darker shading indicates a higher current density.

With the light emitting element 100, since the distance between the first extending portion and the third extending portions is short, current concentrates between the first connecting portion and second connecting portion, and current tends to accumulate in the center. In contrast, with the light emitting elements 10A, 50, and 80, in which the distance between the first extending portion and the third extending portions is increased, there is less concentration of current in the center portion. Also, current is diffused up to the periphery of the semiconductor stack by shortening the distance between the second extending portions and the fourth extending portions, and the distance between the third extending portions and the second extending portions in a direction perpendicular to the first extending portion, as distance from the first connecting portion and the second connecting portion increases (that is, as the distance from the periphery of the semiconductor stack decreases).

As to the light emitting element 80, the third extending portions are longer than that of the light emitting element 10A, and the distal ends of the third extending portions are closer to the first connecting portion than that of the light emitting element 10A, so current is diffused more in the center portion of the light emitting element 80.

As to the light emitting element 50, because the first connecting portion is disposed around (on one side of) the semiconductor stack, and the distal ends of the fourth extending portions extend to near the corners of the semiconductor stack, it can be seen that current spreads out in the corners of the semiconductor stack as well.

Similar effect is obtained in current density distribution with the light emitting elements 20A, 30, 40, 60, 70, and 90 in the other Examples.

Three each of the light emitting elements of the abovementioned Examples 1, 3, 4, 5, 6 and 8 (that is, the light emitting elements 10A, 30, 40, 50, 60, and 80) were prepared, and the light emitting element 100 of the Reference Example was similarly prepared. These light emitting elements were evaluated as follows.

The light emitting elements 10A, 30, 40, 50, and 60 was checked for the effect of distance between the first connecting portion of the n-side electrode (the first electrode) and the second connecting portion of the p-side electrode (the second electrode). Current of 350 mA was applied to each light emitting element, and the Po, Vf, and initial power efficiency were compared, which revealed these to be better in the light emitting elements 10A, 30, and 40 than in the light emitting elements 50 and 60. Consequently, from the standpoint of Po, Vf, and initial power efficiency, it is preferable for the first connecting portion and the second connecting portion to be provided somewhat closer together, and it can be seen that the first connecting portion of the n-side electrode is preferably surrounded by the p-type semiconductor layer rather than being in contact with the closest edge of the semiconductor stack.

A current of 350 mA was applied to the light emitting elements 10A and 80 and the light emitting element 100 of the Reference Example, and the output power (Po) and the forward voltage (Vf) were measured. The output power is given in units of mW.

The initial power efficiency was found from the formula: {output power/(current×voltage)}×100 [%]. The current is in units of mA, and the voltage is in units of V.

As to the initial power efficiency, the light emitting element 80 was better than the light emitting element 10A and the light emitting element 100. For Vf, the light emitting element 80 was better than the light emitting element 10A, and the light emitting element 10A was better than the light emitting element 100.

These effects lead to the conclusion that providing the first connecting portion and the second connecting portion somewhat close together is effective at increasing the power output, and that increasing the distances x and y over the distance z, and somewhat shortening the distance m are effective at reducing the Vf and current accumulation. From the standpoint of initial power efficiency, the light emitting element 80 was the best in that it struck a good balance between these points.

Evaluation of Light Emitting Device

The light emitting element 80 of Example 8 and the light emitting element 100 of the Reference Example were each mounted in a ceramic package having a cavity (3 mm long×3 mm wide×0.52 mm high), and the light emitting element was sealed with a silicone resin containing YAG to produce a white light emitting device. These white light emitting devices were measured for Vf, light flux (lm), and emission efficiency (lm/W), and then compared.

As a result, the white light emitting device in which the light emitting element 80 was mounted was found to have a Vf that was 0.59% lower, a light flux that was 0.39% higher, and an emission efficiency that was 0.93% higher than in the white light emitting device in which the light emitting element 100 was mounted.

Consequently, with a white light emitting device, the current density distribution of the light emitting element 80, that is, the emission distribution, was improved over that of the light emitting device 100 in the Reference Example, so the light flux and the emission efficiency were believed to be improved.

INDUSTRIAL APPLICABILITY

A light emitting element according to the present disclosure can be suitably employed for various lighting apparatuses, in particular, a light source for lighting, an LED display, backlight source for a liquid crystal display device, signals, a lighted switch, various sensors, various indicators, an auxiliary light source for moving image, other consumer light sources, or the like.

What is claimed is:
1. A light emitting element comprising:
a semiconductor structure;
first and second electrodes formed above the semiconductor structure; and
a protective film, wherein:
in a plan view:
the first electrode consists of a first pad electrode configured to be bonded with a first conductive wire and electrically connected to a first external electrode or a first external terminal, a first extending portion extending from the first pad electrode, and two second extending portions extending from the first pad electrode,
the second electrode consists of a second pad electrode configured to be bonded with a second conductive wire and electrically connected to a second external electrode or a second external terminal, and two third extending portions extending from the second pad electrode,
the first extending portion extends linearly in a direction from the first pad electrode toward the second pad electrode,
the two second extending portions are located on opposite sides of the first extending portion, respectively, with each of the second extending portions having two bent portions and a linear portion extending parallel to the first extending portion and located between the two bent portions, and
the two third extending portions are located between the first extending portion and the two second extending portions, respectively, and
the protective film covers the first extending portion, the two second extending portions, and the two third extending portions, while the first pad electrode and the second pad electrode are exposed from the protective film.

2. The light emitting element according to claim 1, wherein:
in the plan view, in directions parallel to the direction in which the first extending portion extends, each of the second extending portions extends beyond a position of the second pad electrode.

3. The light emitting element according to claim 1, wherein:
in the plan view, each of the first pad electrode and the second pad electrode has a substantially circular shape.

4. The light emitting element according to claim 1, wherein:
in the plan view, each of the first pad electrode and the second pad electrode has a substantially polygonal shape.

5. The light emitting element according to claim 1, wherein:
in the plan view:
a maximum dimension of the first pad electrode is greater than widths of each of the first extending portion and the second extending portions; and
a maximum dimension of the second pad electrode is greater than widths of each of the third extending portions.

6. The light emitting element according to claim 1, wherein:
in the plan view:
distances between the first extending portion and the second extending portions, respectively, are the same; and
distances between the first extending portion and the third extending portions, respectively, are the same.

7. The light emitting element according to claim 1, wherein:
in the plan view, the two third extending portions extend to form a U shape.

8. The light emitting element according to claim 1, wherein:
in the plan view, in directions parallel to the direction in which the first extending portion extends, at least a portion of one of the two bent portions of each of the second extending portions extends beyond a position of the second pad electrode.

9. The light emitting element according to claim 1, wherein:
in the plan view, each of the two second extending portions further includes an additional linear portion extending from one of the two bent portions in a direction perpendicular to the direction in which the first extending portion extends.

10. The light emitting element according to claim 1, wherein:
the semiconductor structure comprises a first conductivity type semiconductor layer and a second conductivity type semiconductor layer, and
the first conductivity type semiconductor layer is disposed over the second conductivity type semiconductor layer.

11. The light emitting element according to claim 10, wherein:
each of the first conductivity type semiconductor layer and the second conductivity type semiconductor layer is made of a nitride semiconductor material represented by a general formula $In_XAl_YGa_{1-X-Y}N$ ($0 \leq X \leq 1$, $0 \leq Y \leq 1$, $X+Y \leq 1$).

12. The light emitting element according to claim 10, wherein:
the first electrode is formed on the first conductivity type semiconductor layer, and
the second electrode is formed on the second conductivity type semiconductor layer.

13. The light emitting element according to claim 10, wherein:
the first conductivity type semiconductor layer is a p-type semiconductor layer, and
in the plan view, the first electrode and the second electrode are entirely surrounded by the p-type semiconductor layer.

14. The light emitting element according to claim 1, wherein:
in the plan view, the first extending portion extends from the first pad electrode to a distal end without branching.

15. The light emitting element according to claim 1, wherein:
in the plan view, each of the two second extending portions extends from the first pad electrode to a distal end without branching.

16. The light emitting element according to claim 1, wherein:
in the plan view, each of the two third extending portions extends from the second pad electrode to a distal end without branching.

17. The light emitting element according to claim 1, wherein:
in the plan view:
the first extending portion extends from the firstpad electrode to a distal end without branching,
each of the two second extending portions extends from the first pad electrode to a distal end without branching, and
each of the two third extending portions extends from the second pad electrode to a distal end without branching.

18. A light emitting element comprising:
a semiconductor structure; and
first and second electrodes formed above the semiconductor structure, wherein:
in a plan view:
the first electrode consists of a first pad electrode configured to be bonded with a first conductive wire and electrically connected to a first external electrode or a first external terminal, a first extending portion extending from the first pad electrode, and two second extending portions extending from the first pad electrode,
the second electrode consists of a second pad electrode configured to be bonded with a second conductive wire and electrically connected to a second external electrode or a second external terminal, and two third extending portions extending from the second pad electrode,
the first extending portion extends linearly in a direction from the first pad electrode toward the second pad electrode,
the two second extending portions are located on opposite sides of the first extending portion, respectively, with each of the second extending portions having two bent portions and a linear portion extending parallel to the first extending portion and located between the two bent portions, the two third extending portions are located between the first extending portion and the two second extending portions, respectively, in directions parallel to the direction in which the first extending portion extends, each of the second extending portions extends beyond a position of the second pad electrode, and each of the first pad electrode and the second pad electrode has a substantially circular shape.

19. The light emitting element according to claim 18, wherein:

in the plan view:

a maximum dimension of the first pad electrode is greater than widths of each of the first extending portion and the second extending portions; and a maximum dimension of the second pad electrode is greater than widths of each of the third extending portions.

20. The light emitting element according to claim 18, wherein:

in the plan view:

distances between the first extending portion and the second extending portions, respectively, are the same; and distances between the first extending portion and the third extending portions, respectively, are the same.

21. The light emitting element according to claim 18, wherein:

in the plan view, the two third extending portions extend to form a U shape.

22. The light emitting element according to claim 18, wherein:

in the plan view, in directions parallel to the direction in which the first extending portion extends, at least a portion of one of the bent portions of each of the second extending portions extends beyond a position of the second pad electrode.

23. The light emitting element according to claim 18, wherein:

in the plan view, each of the two second extending portions further includes an additional linear portion extending from one of the two bent portions in a direction perpendicular to the direction in which the first extending portion extends.

24. The light emitting element according to claim 18, wherein:

the semiconductor structure comprises a first conductivity type semiconductor layer and a second conductivity type semiconductor layer, and the first conductivity type semiconductor layer is disposed over the second conductivity type semiconductor layer.

25. The light emitting element according to claim 24, wherein:

each of the first conductivity type semiconductor layer and the second conductivity type semiconductor layer is made of a nitride semiconductor material represented by a general formula $In_XAl_YGa_{1-X-Y}N$ ($0 \leq X \leq 1$, $0 \leq Y \leq 1$, $X+Y \leq 1$).

26. The light emitting element according to claim 24, wherein:

the first electrode is formed on the first conductivity type semiconductor layer, and the second electrode is formed on the second conductivity type semiconductor layer.

27. The light emitting element according to claim 24, wherein:

the first conductivity type semiconductor layer is a p-type semiconductor layer, and in the plan view, the first electrode and the second electrode are entirely surrounded by the p-type semiconductor layer.

28. The light emitting element according to claim 18, wherein:

in the plan view, the first extending portion extends from the first pad electrode to a distal end without branching.

29. The light emitting element according to claim 18, wherein:

in the plan view, each of the two second extending portions extends from the first pad electrode to a distal end without branching.

30. The light emitting element according to claim 18, wherein:

in the plan view, each of the two third extending portions extends from the second pad electrode to a distal end without branching.

31. The light emitting element according to claim 18, wherein:

in the plan view:

the first extending portion extends from the first pad electrode to a distal end without branching, each of the two second extending portions extends from the first pad electrode to a distal end without branching, and each of the two third extending portions extends from the second pad electrode to a distal end without branching.

\* \* \* \* \*